United States Patent [19]

Patillon et al.

[11] Patent Number: 4,857,974
[45] Date of Patent: Aug. 15, 1989

[54] CIRCUIT COMPRISING CONDUCTIVE LINES FOR THE TRANSFER OF HIGH-SPEED SIGNALS

[75] Inventors: Jean-Noël Patillon; Bertrand Gabillard; Gérard M. Martin, all of Paris, France

[73] Assignee: U.S. Philips Corporation, New York, N.Y.

[21] Appl. No.: 156,375

[22] Filed: Feb. 16, 1988

[30] Foreign Application Priority Data

Feb. 20, 1987 [FR] France ................................ 87 02233

[51] Int. Cl.⁴ ............................................ H01L 29/80
[52] U.S. Cl. ........................................ 357/22; 357/16; 357/27
[58] Field of Search .......................... 357/22 A, 27, 16

[56] References Cited

U.S. PATENT DOCUMENTS

| | | | |
|---|---|---|---|
| 4,714,948 | 12/1987 | Mimura | 357/22 A |
| 4,740,822 | 10/1988 | Itoh | 357/22 A |
| 4,748,484 | 5/1988 | Takakuwa | 357/22 A |
| 4,758,868 | 10/1988 | Frijlink | 357/22 A |

*Primary Examiner*—Martin H. Edlow
*Attorney, Agent, or Firm*—Paul R. Miller

[57] ABSTRACT

This circuit comprising conductive lines for the transfer of high-speed signals is formed from a semiconductor material in the presence of a two-dimensional gas 2DG between two of its layers (3 and 4). By a suitable choice of the conditions of the temperature and of the magnetic field $\vec{B}$, it is then made superconducting, thus permitting the transport of high-speed signals without delay and without distortion of the signals.

7 Claims, 1 Drawing Sheet

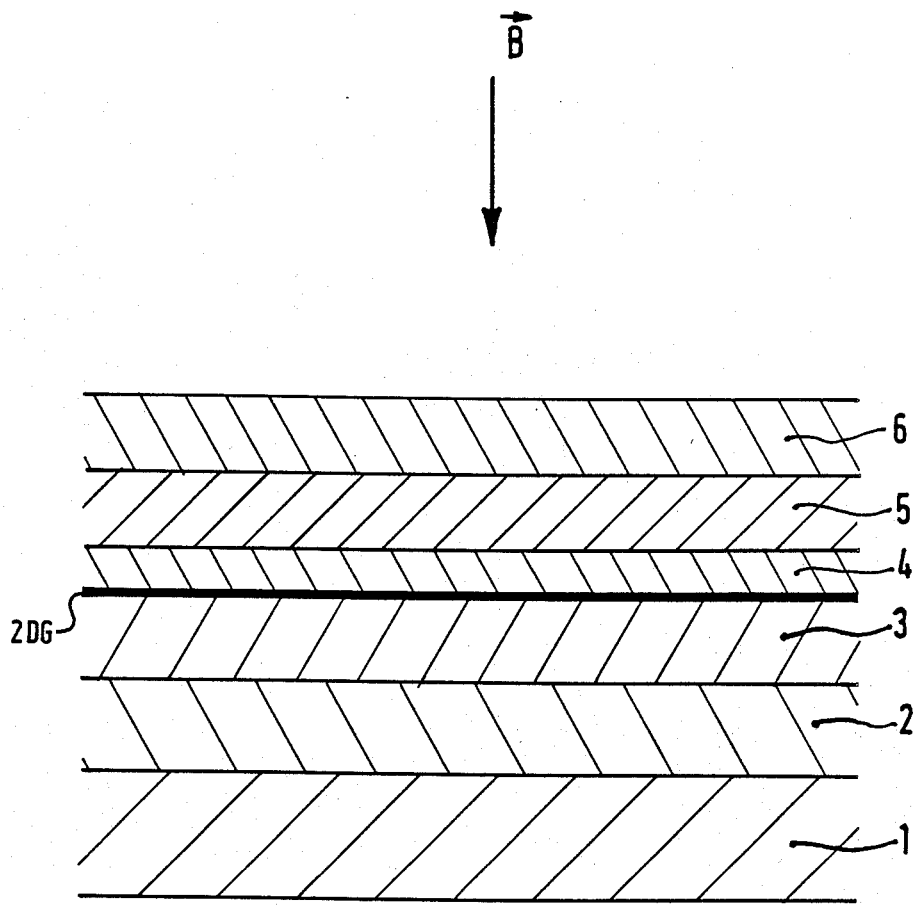

CIRCUIT COMPRISING CONDUCTIVE LINES FOR THE TRANSFER OF HIGH-SPEED SIGNALS

The invention relates to an integrated circuit comprising a semiconductor body with a plurality of circuit elements and interconnections between the circuit elements.

Circuits comprising conductive lines for the transfer of high-speed signals are frequently used and known per se. In fact, any semiconductor material permits transporting of signals, whether they are low-speed or high-speed signals. However, when the signals have very steep leading edges, a great disadvantage appears, i.e. the conductive material due to its resistance R and its capacitance C will integrate the leading edges according to the RC time constant, that is to say that the edges will be "blurred" and that moreover a delay will be imposed on the circulation of the signals. Besides, considerable technical progress is made in the design and the realization of the actual electronic circuits and devices, the times of access to the circuits and devices are gradually reduced and their operating speeds are gradually increased. In order to prevent a detrimental effect on such advantages, it is therefore essential that the conductive lines giving access to the inputs and outputs of circuits and devices are capable of ensuring transmission of the signals with an extremely high velocity and without distortion.

The present invention proposes an effective means for avoiding the aforementioned disadvantage.

Therefore and in order to permit transmissions and operations of ultra-high speed circuits, the circuit described in the preamble is characterized in that the semiconductor body comprises a stratified structure with at least a first semiconductor layer having a first energy gap and a second semiconductor layer having a second energy gap higher than the first energy gap, with the first and second semiconductor layers forming an interface between them and a two-dimensional charge carrier gas forming a current path near the interface, in which on application of a sufficiently high magnetic field component perpendicular to the interface and at a sufficiently low temperature the current path becomes superconducting so that at least the longitudinal resistance of the current path is reduced substantially to zero. Thus, in predetermined temperature and magnetic field conditions the material of the circuit is made superconducting, and when the longitudinal resistance of the conductive lines becomes quasi zero, the conduction is quasi ideal, that is to say that the signals applied to the lines can propagate substantially at the speed of the light in the considered medium. Therefore, the delays and distortions of signals ascertained during the propagation of the latter in conventional conducting materials are suppressed and the ultra-high-speed electronic circuits or devices can then potentially be utilized without limitation of their performance.

Moreover, it is of importance to emphasize that the circuit according to the invention utilized in the aforementioned conditions benefits from another great advantage. In fact, it has been found from laboratory experiments that the transversal resistance of each of the conductive lines tends to an infinite value, which means that every conductive line is perfectly insulated from its environment.

The following description with reference to the accompanying drawing, given by way of example, will clearly describe how the invention can be realized.

The sole FIGURE shows a possible structure of the material of the circuit in cross-section.

The material must have a two-dimensional electronic carrier gas of either electrons or holes; and it is obtained from the stack of layers of a material having a small forbidden band and a material having a larger forbidden band (or conversely). The two-dimensional gas is situated at the interface of these two layers and the presence of the gas makes the material semiconducting. A large variety of materials and especially III-V materials which are particularly suitable for this application including their ternary and quaternary alloys permit a large number of combinations of the materials. According to a preferred embodiment of the circuit in accordance with the invention, the choice is made for a combination of the type AlGaAs/GaAs. However, it is quite clear that this choice is not limiting; other combinations could be very suitable, such as, for example;

InP/GaInAs
GaAs/GaInAs
AlGaInAs/GaInAs
AlInAs/GaInAs
GaInP/GaAS etc. . . .

The FIGURE shows in cross-section the epitaxial structure of the circuit comprising the conductive lines.

The epitaxial structure is obtained on a substrate layer 1 of semi-insulating chromium-doped GaAs. It is constituted by a layer 2 of undoped AlGaAs having a thickness L2 ($0.5\ \mu m \leq L2 \leq 1\ \mu m$), by a layer 3 of undoped GaAs having a thickness L3 ($0.5\ \mu m \leq L3 \leq 1\ \mu m$), by a thin layer 4 of undoped AlGaAs having a thickness L4 ($20\ \text{Å} \leq L4 \leq 100\ \text{Å}$), by a layer 5 of silicon-doped AlGaAs haivng a thickness L5 ($50\ \text{Å} \leq L5 \leq 500\ \text{Å}$, $N_{D5} \approx 10^{18}\ cm^{-3}$), and finally by a layer 6 of silicon-doped GaAs having a thickness L6 ($50\ \text{Å} < L6 < 500\ \text{Å}$, $N_{D6} \approx 10^{18}\ cm^{-3}$). The two-dimensional gas denoted by 2DG is located at the heterojunction of the layers 3 and 4. The thicknesses of the layers 4 and 5 and the doping of the layer 5 are chosen so that the density of electrons of the gas having two dimensions $n_{2D}$ is of the order of $3 \times 10^{11}\ cm^{-2}$.

This density of electrons corresponds to the formation of the Hall plateau corresponding to the second Landau sublevel of the two-dimensional gas for a magnetic field $\overline{B}$, the induction of which is less than 7 Teslas, the effect being obtained for this plateau (the magnetic field being applied perpendicularly to the conductive lines). It is obvious that the present invention may extend to higher gas concentrations and to Hall plateaus obtained at larger magnetic fields.

On the other hand, in order to obtain a quasi ideal conduction, in combination with the other characteristics, the temperature is kept low. In the embodiment chosen, it was of the order of a few °K. (4.2° K).

Such effects are clearly described in a number of handbooks or publications, for example by H. L. Störmer in "Novel Physics in Two Dimensions", SURFACE SCIENCE, Vol. 142 (1984), pages 130 to 146, more particularly page 137, section 3.3.

It is possible to obtain from the material thus formed conductive lines of arbitrary form, i.e. by means of several known methods:

by ion implantation (for example boron, hydrogen. . . ) outside the conductive lines in order to make the material non-conducting (or of three-dimensional conduction), by ion implantation and sintering outside the conductive lines (partial destruction), by local diffusion outside the conductive lines, by chemical ion etching, etc. . . .

In fact, a total or partial destruction of the material is carried out outside the lines in order that only the desired lines subsist.

Such a circuit comprising conductive lines can readily be obtained; it can particularly and advantageously be used in new applications, especially for use in a microcomputer, in which the environment (magnetic field, low temperature) required to obtain the superconducting effect is normally provided.

What is claimed is:

1. Integrated circuit comprising a semiconductor body with a plurality of circuit elements and interconnections between said circuit elements, characterized in that said semiconductor body comprises a stratified structure with at least a first semiconductor layer having a first energy gap and a second semiconductor layer having a second energy gap higher than said first energy gap, said first and second semiconductor layers forming an interface between them and a two-dimensional charge carrier gas forming a current path near said interface, in which on application of a sufficiently high magnetic field component perpendicular to said interface and at a sufficiently low temperature said current path becomes superconducting so that at least the longitudinal resistance of said current path is reduced substantially to zero.

2. Integrated circuit as claimed in claim 1, characterized in that said first semiconductor layer comprises at least a semiconductor material of the group or gallium arsenide and gallium indium arsenide, and in that said second semiconductor layer comprises at least a semiconductor material of the group of indium phosphide, gallium indium arsenide, aluminium gallium indium arsenide, aluminium indium arsenide and gallium indium phosphide.

3. Integrated circuit as claimed in claim 1, characterized in that said interconnections are laterally bounded by an implanted semiconductor region.

4. Integrated circuit as claimed in claim 1 or 2, characterized in that said interconnections are laterally bounded by a diffused semiconductor region.

5. Integrated circuit as claimed in claim 1 or 2, characterized in that said magnetic field component is lower than 7 Tesla.

6. Integrated circuit as claimed in claim 1 or 2, characterized in that the two-dimensional carrier gas is an electron gas with an electron density of about $3 \times 10^{11}$ per square cm.

7. Integrated circuit as claimed in claim 1 or 2, characterized in that the stratified structure comprises on a semi-insulating substrate an undoped layer of aluminium gallium arsenide of thickness $\leq 1$ $\mu$m and $\geq 0.5$ $\mu$m, an undoped layer of gallium arsenide of thickness $\leq 1$ $\mu$m and $\geq 05$, $\mu$m, an undoped layer of alumium gallium arsenide of thickness $\leq 10$ nm and $\geq 2$ nm, a $10^{18}$ cm$^{-3}$ silicon doped layer of aluminium gallium arsenide of thickness $\leq 50$ nm and $\geq 5$ nm and a $10^{18}$ cm$^{-3}$ silicon doped layer of gallium arsenide of thickness $\leq 50$ nm and $\geq 5$ nm.

* * * * *